(12) United States Patent
Hou

(10) Patent No.: US 8,993,913 B2
(45) Date of Patent: Mar. 31, 2015

(54) COVER GLASS PRESSURE BUTTON

(75) Inventor: Chih-Sheng Hou, Taipei (TW)

(73) Assignee: Universal Cement Corporation, Taipei (TW)

( * ) Notice: Subject to any disclaimer, the term of this patent is extended or adjusted under 35 U.S.C. 154(b) by 324 days.

(21) Appl. No.: 13/556,256

(22) Filed: Jul. 24, 2012

(65) Prior Publication Data
US 2012/0305378 A1 Dec. 6, 2012

Related U.S. Application Data

(63) Continuation-in-part of application No. 13/151,385, filed on Jun. 2, 2011, now Pat. No. 8,779,315.

(51) Int. Cl.
| | |
|---|---|
| *H01H 1/14* | (2006.01) |
| *H03K 17/96* | (2006.01) |
| *H01H 13/785* | (2006.01) |
| *H04M 1/02* | (2006.01) |

(52) U.S. Cl.
CPC .......... *H03K 17/964* (2013.01); *H01H 13/785* (2013.01); *H04M 1/0266* (2013.01); *H01H 2201/02* (2013.01); *H01H 2231/016* (2013.01); *H01H 2231/022* (2013.01)

USPC .......................................................... 200/534

(58) Field of Classification Search
CPC ............ H01H 13/785; H01H 2201/02; H01H 2231/016; H01H 13/12; H01H 13/52; H01H 13/70; H01H 59/0009; H01H 57/00; H01H 1/20
USPC .............. 200/520, 510, 51.16, 333, 341, 181, 200/534; 310/314, 319, 311
See application file for complete search history.

(56) References Cited

U.S. PATENT DOCUMENTS

| | | | |
|---|---|---|---|
| 7,271,361 B2 * | 9/2007 | Sugimura et al. ............. | 200/341 |
| 8,262,480 B2 * | 9/2012 | Cohen et al. .................... | 463/37 |
| 2007/0119698 A1 * | 5/2007 | Day .............................. | 200/510 |
| 2009/0140985 A1 * | 6/2009 | Liu ............................... | 345/168 |

* cited by examiner

*Primary Examiner* — Edwin A. Leon
(74) *Attorney, Agent, or Firm* — Lowe Hauptman & Ham, LLP

(57) ABSTRACT

A cover glass pressure button (CGPB) is disclosed for an electronic device that has an image display module which is protected by a cover glass. When the cover glass is pressed, the CGPB senses the pressure to output a corresponding physical parameter to a control circuit for triggering a function of the image display module.

25 Claims, 20 Drawing Sheets

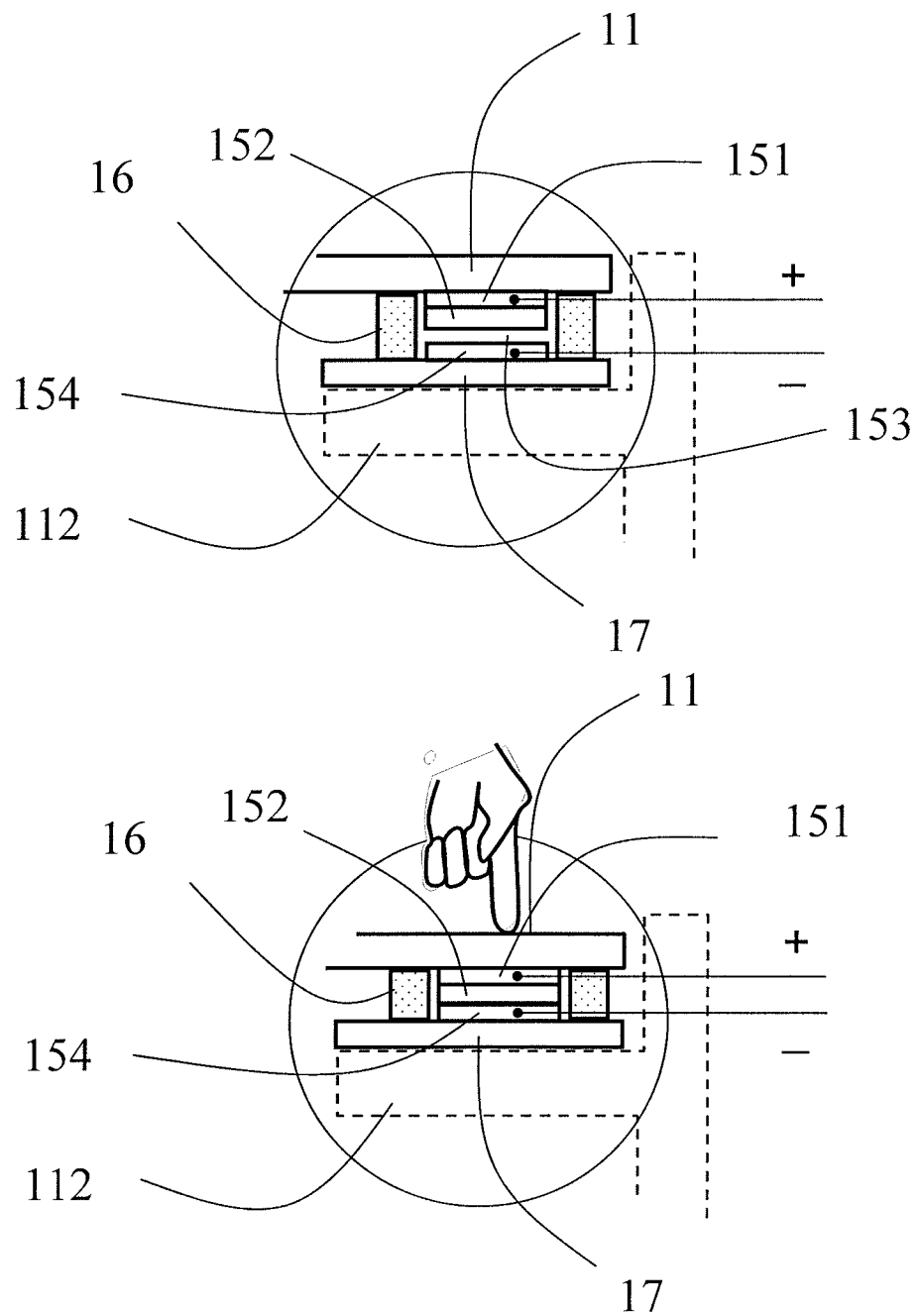

Goal

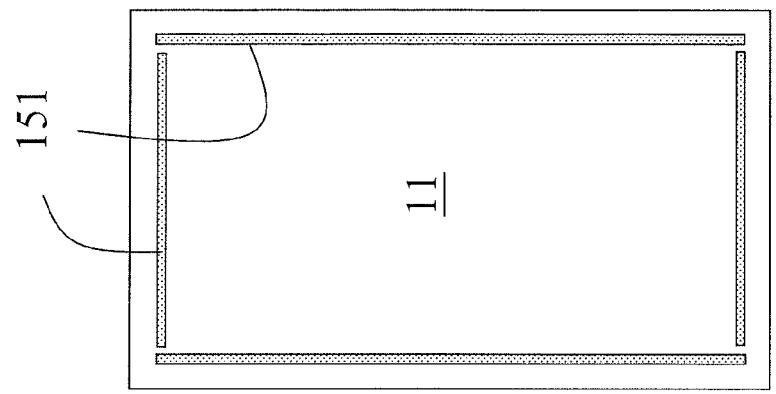
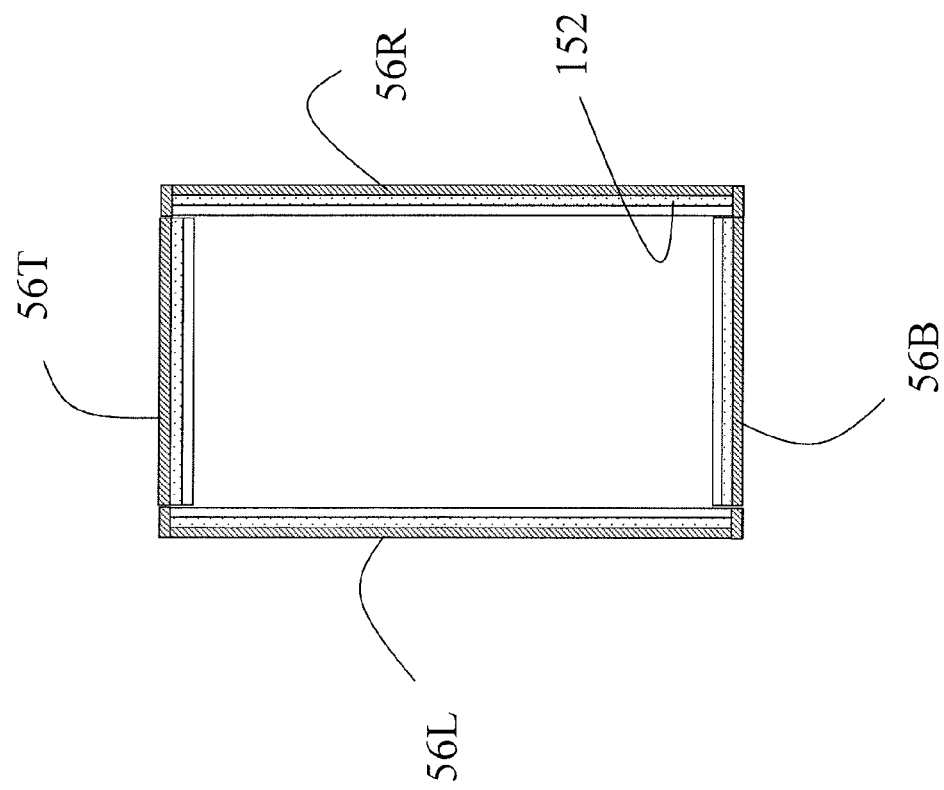

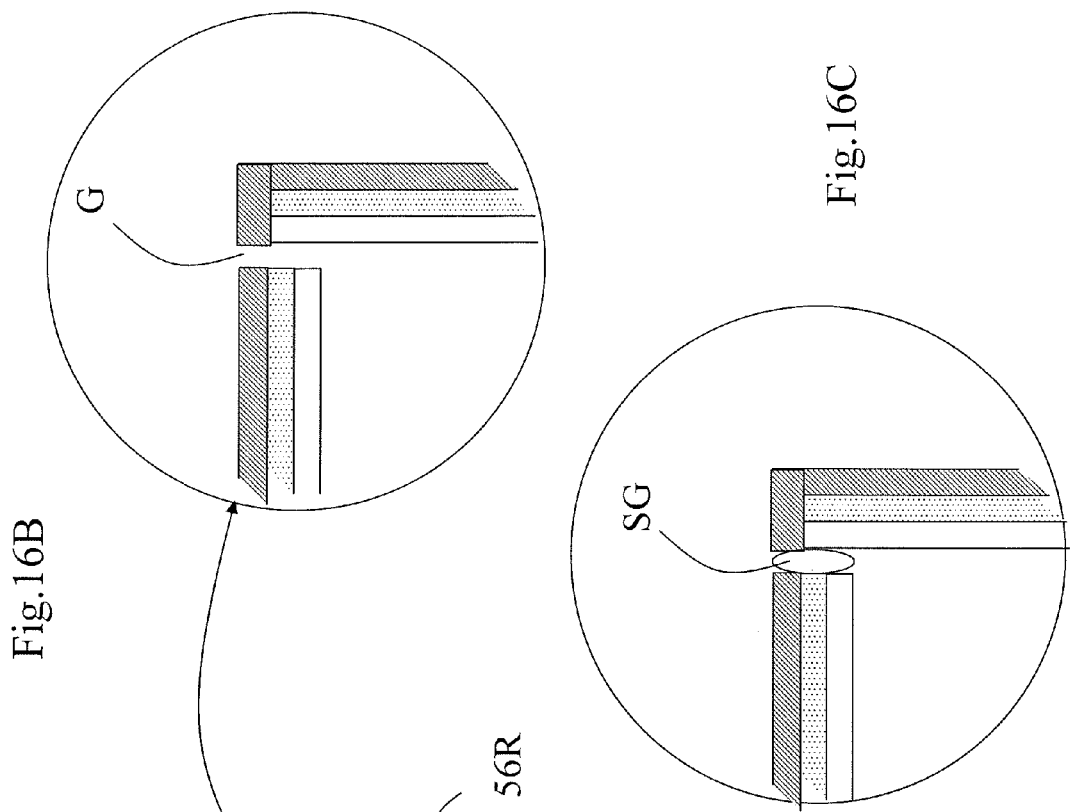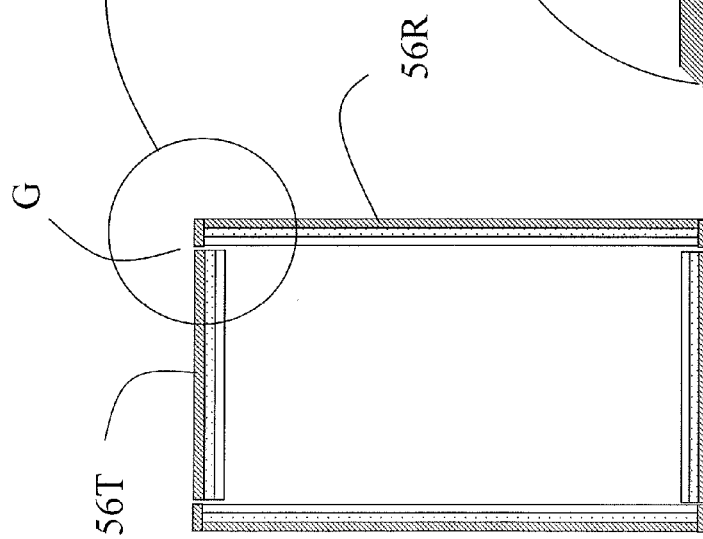

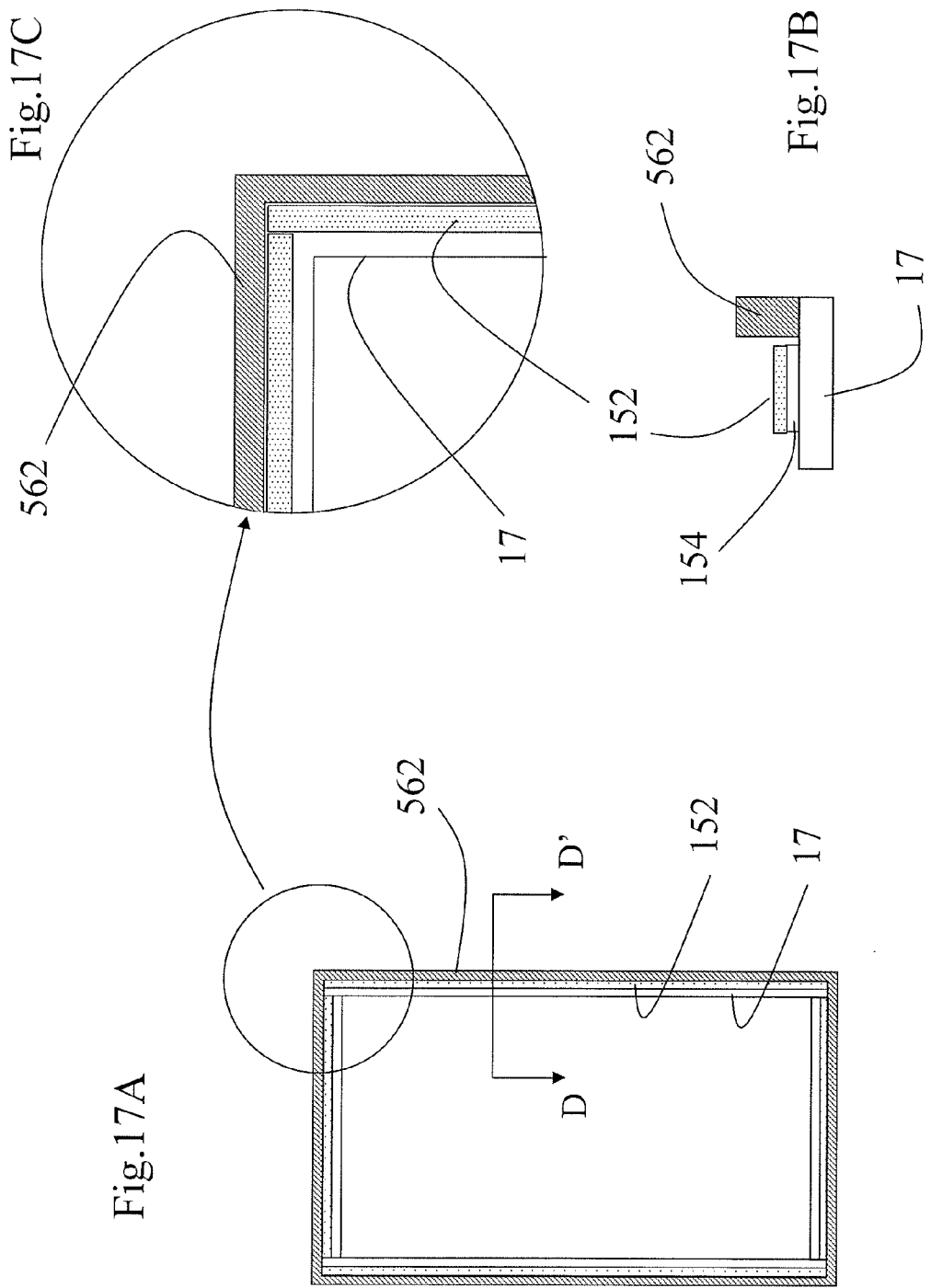

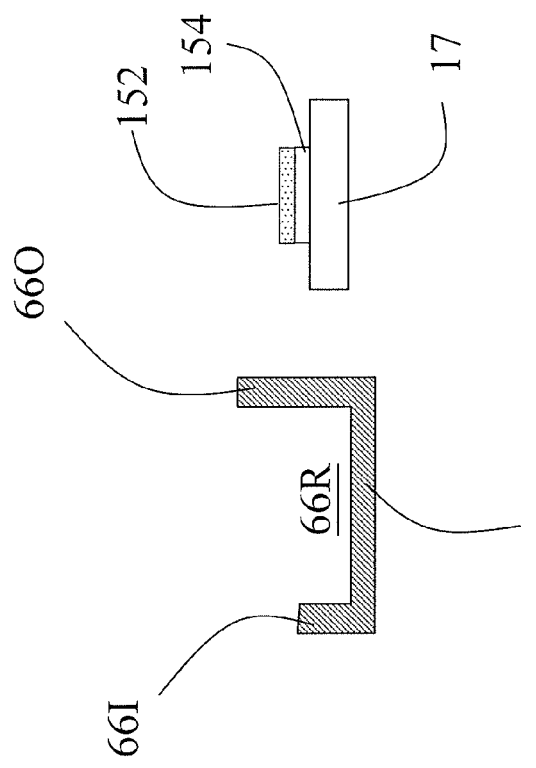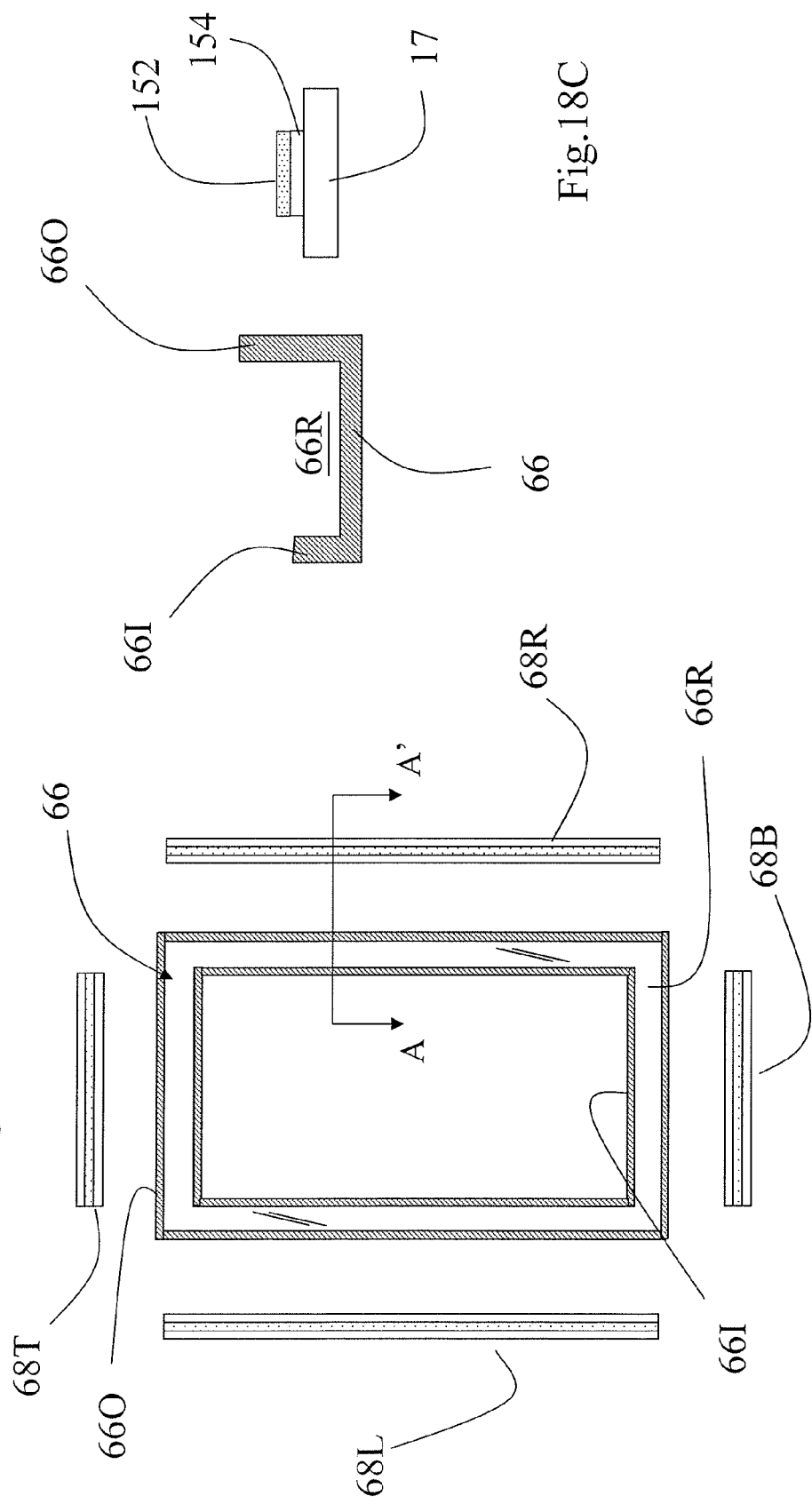

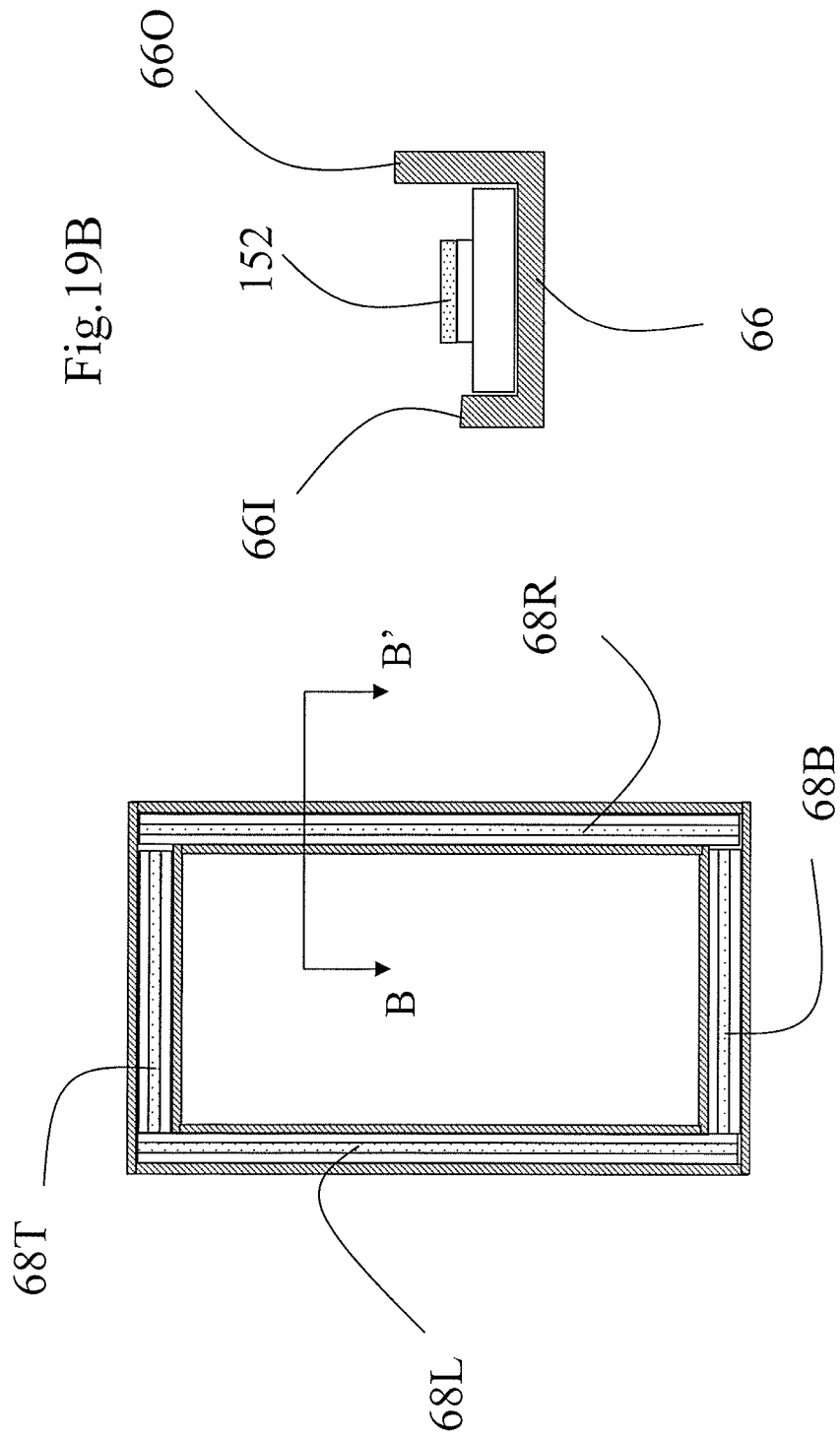

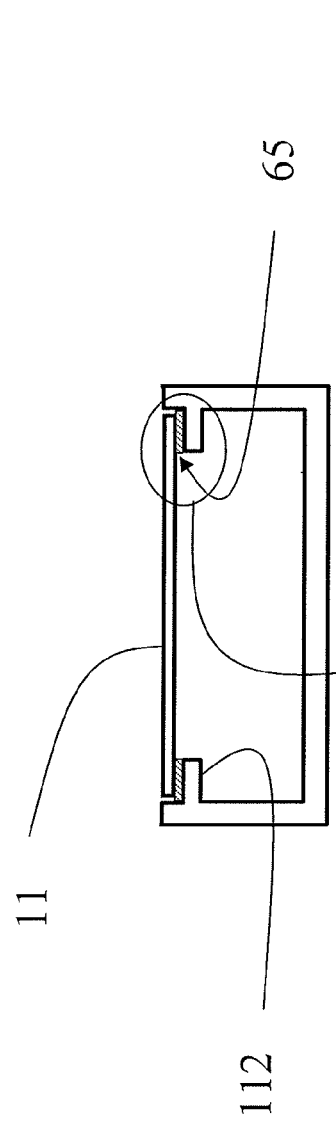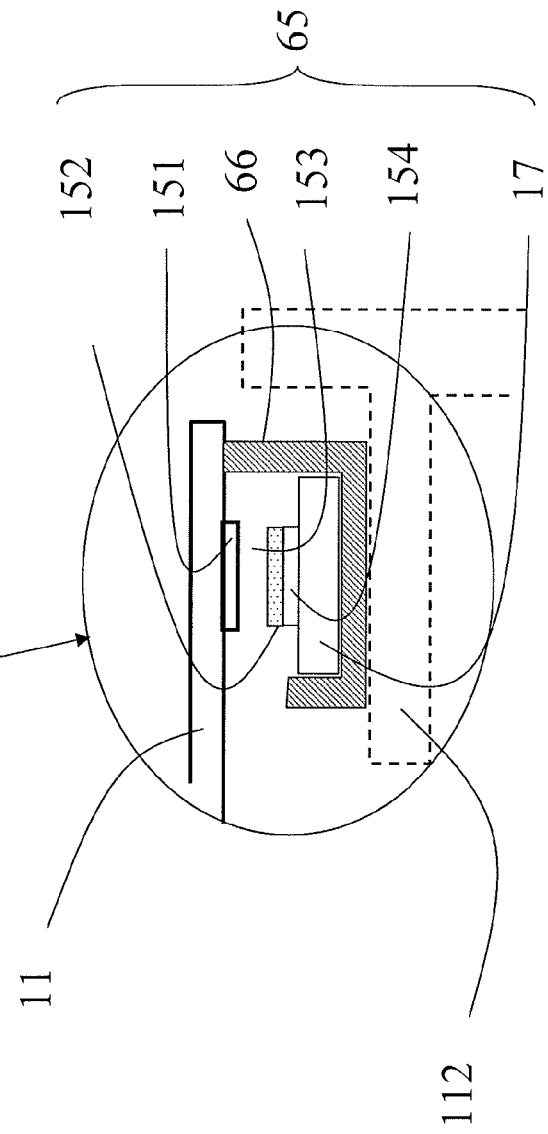
Fig.20A
Fig.20B

COVER GLASS PRESSURE BUTTON

This application is a continuation-in-part application of U.S. application Ser. No. 13/151,385 filed Jun. 2, 2011, now U.S. Pat. No. 8,779,315, the disclosure of which is incorporated by reference herein in its entirety.

BACKGROUND

1. Technical Field

The present invention relates to a pressure button, especially to a cover glass pressure button (CGPB) for an electronic device which has an image display and a cover glass.

2. Description of Related Art

FIG. 1A shows a top view of a prior art cell phone.

A piece of cover glass 11 is mounted on top of a cell phone 10. Dash line frame 12 shows an visible display area of an image display module in the cell phone 10.

FIG. 1B shows a section view of FIG. 1A according to line AA'

A flange 112 is designed for holding the cover glass 11 in a cell phone 10. The cover glass 11 has a top surface 11T and a bottom surface 11B. An image display module 115 is configured below the cover glass 11 for displaying images. A space is reserved in between the cover glass 11 and the image display module 115. The cover glass 11 is a protection layer for underlying elements.

BRIEF DESCRIPTION OF THE DRAWINGS

FIG. 3A shows the first embodiment before being pressed.
FIG. 3B shows the first embodiment being pressed.
FIG. 15A shows a top view of the components for the fifth embodiment of the present invention.
FIG. 15B shows a bottom view of the cover glass for the fifth embodiment of the present invention.
FIGS. 16A~16C show a gap between neighboring sealing adhesives.
FIGS. 17A~17C show a sixth embodiment of the present invention.
FIGS. 18A~18C show a seventh embodiment of the present invention.
FIGS. 19A~19B show a status after the sub-unit configured in the recess.
FIGS. 20A~20B show the assembly of the seventh embodiment according to the present invention.

DETAILED DESCRIPTION OF THE INVENTION

This invention discloses a cover glass pressure button (CGPB) for an electronic device such as a cell phone, a portable media player, a tablet, or a personal digital assistant (PDA) . . . etc. that has a cover glass on top.

Figures 1A, 1B:
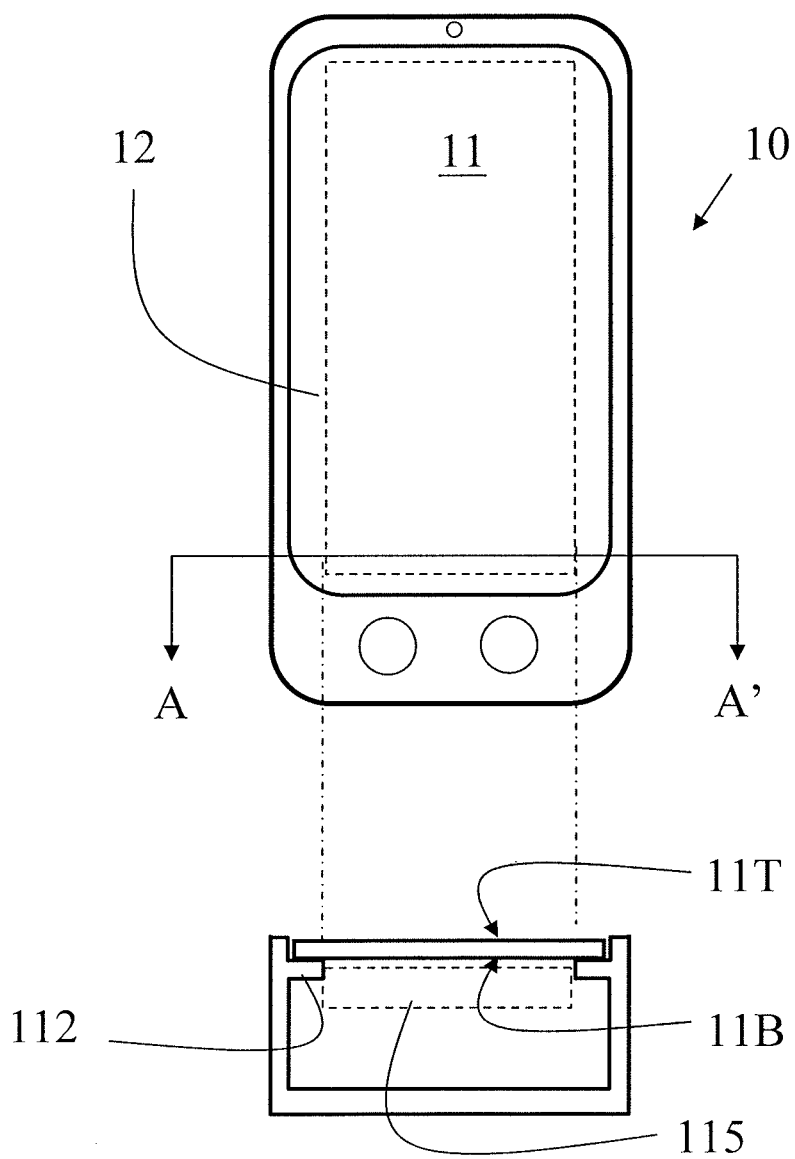
FIG. 1A shows a top view of a prior art cell phone.
FIG. 1B shows a section view of FIG. 1A according to line AA'.
Figures 2A, 2B:
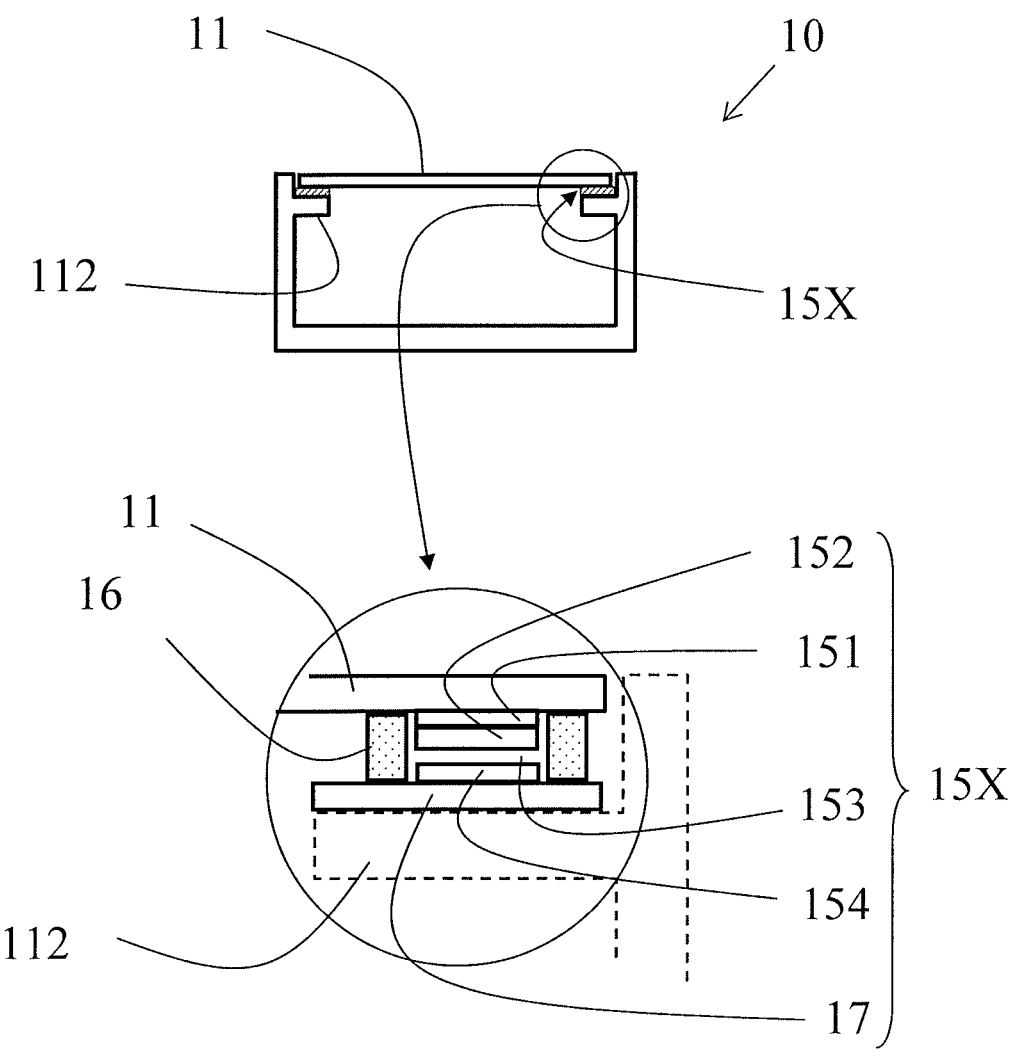
FIG. 2A shows a first embodiment of the present invention.
FIG. 2B shows an enlarged view of partial area of FIG. 2A.

FIG. 2A shows a first embodiment of the present invention.

A cover glass 11 is mounted on top of a cell phone 10. A microstructure 15X is configured in between the cover glass 11 and a flange 112. The microstructure 15X incorporating the cover glass 11 forms a CGPB according to the present invention.

FIG. 2B shows an enlarged view of partial area of FIG. 2A.

The microstructure 15X is configured on bottom surface of the cover glass 11. A top electrode 151 is configured on bottom surface of the cover glass 11. A piece of piezoresistive material 152 or other pressure sensitive material is configured on the bottom surface of the top electrode 151. A space 153 is reserved under the piezoresistive material 152. A bottom electrode 154 is configured under the space 153 and formed on a bottom substrate 17. The microstructure 15X incorporating the cover glass 11 forms a CGPB. The CGPB is configured on top of the flange 112 of the cell phone 10. When the cover glass 11 is depressed, the CGPB senses the pressure to output a corresponding physical parameter e.g. conductivity (piezoresistive material), charge, or capacitance, to a control circuit (not shown) for triggering a predetermined function. A pair of depressible spacers 16, in the section view, is configured in between the cover glass 11 and the bottom substrate 17 for keeping the space 153 in between the piezoresistive material 152 and the bottom electrode 154.

FIG. 3A shows the first embodiment before being pressed.

Before the cover glass 11 is pressed, the space 153 in between the piezoresistive material 152 and the bottom electrode 154 keeps the electrical path open between the top electrode 151 and the bottom electrode 154.

FIG. 3B shows the first embodiment being pressed.

After the cover glass 11 is pressed, the space 153 disappears. When the piezoresistive material 152 touches the bottom electrode 154, the electrical path becomes closed between the top electrode 151 and the bottom electrode 154.

Figure 4:
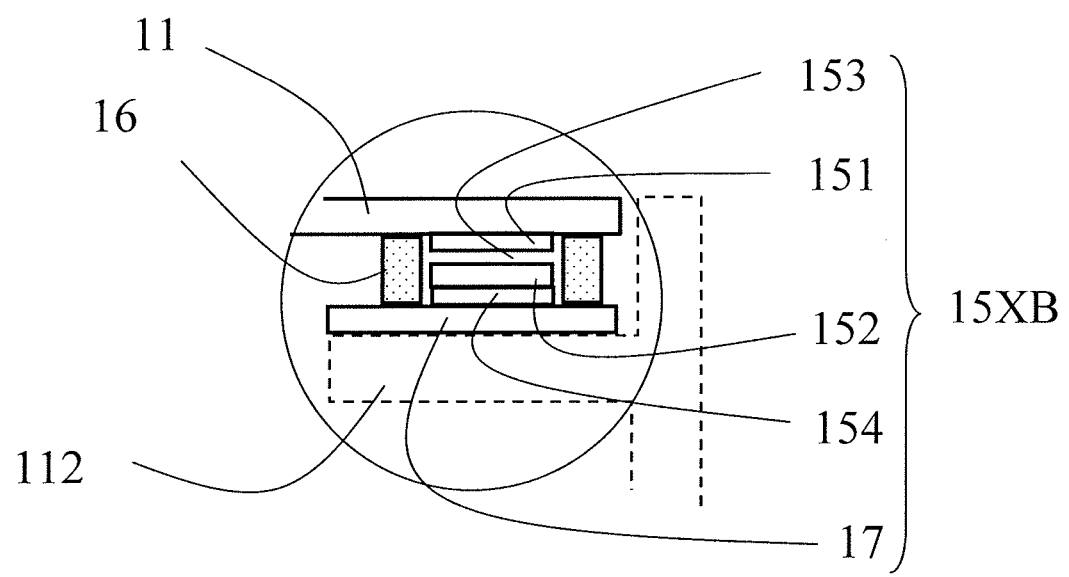
FIG. 4 shows a second embodiment of the present invention.

FIG. 4 shows a second embodiment of the present invention.

The structure is similar to the structure of FIG. 3A, and only the piezoresistive material 152 and the space 153 are reversed in position. The microstructure 15XB is configured on bottom surface of the cover glass 11. A top electrode 151 is configured on bottom surface of the cover glass 11. A space 153 is reserved under top electrode 151. A piece of piezoresistive material 152 is configured under the space 153. A bottom electrode 154 is configured on bottom surface of the piezoresistive material 152 and formed on a bottom substrate 17. The microstructure 15XB incorporating the cover glass 11 forms a CGPB.

Figures 5A, 5B:
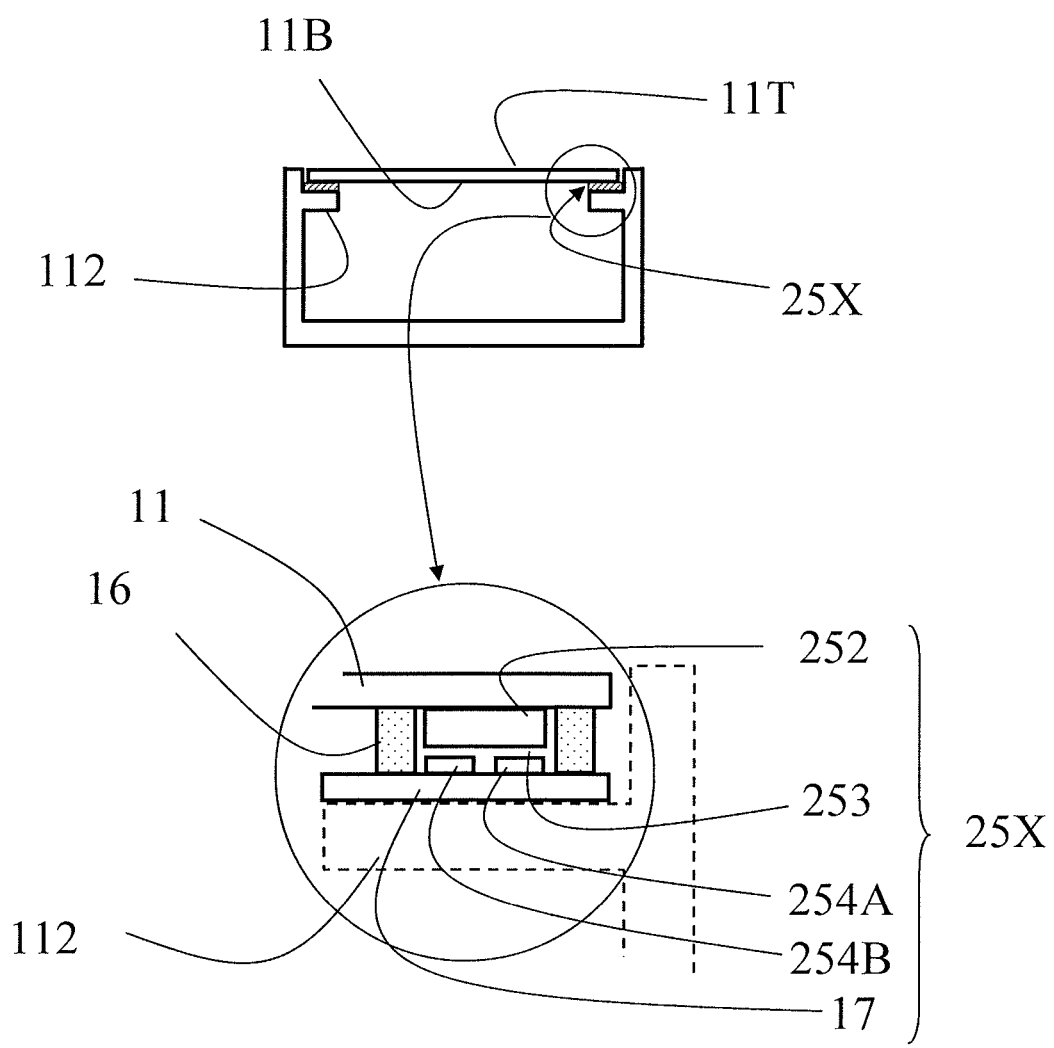
FIG. 5A shows a third embodiment of the present invention.
FIG. 5B shows an enlarged view of partial area of FIG. 5A.

FIG. 5A shows a third embodiment of the present invention.

A cover glass 11 is mounted on top of a cell phone 10. A microstructure 25X is configured in between the cover glass 11 and the flange 112. The microstructure 25X incorporating the cover glass 11 forms a CGPB according to the present invention.

FIG. 5B shows an enlarged view of partial area of FIG. 5A.

The microstructure 25X is configured on bottom surface of the cover glass 11. A piece of piezoresistive material 252 is configured on bottom surface of the cover glass 11. A space 253 is reserved under the piezoresistive material 252. A first electrode 254A and a second electrode 254B are configured under the space 253 and formed on a bottom substrate 17. A pair of depressible spacers 16, in the section view, is configured in between the cover glass 11 and the bottom substrate 17 for keeping the space 253 in between the piezoresistive material 252 and the electrodes 254A, 254B.

Figure 6:
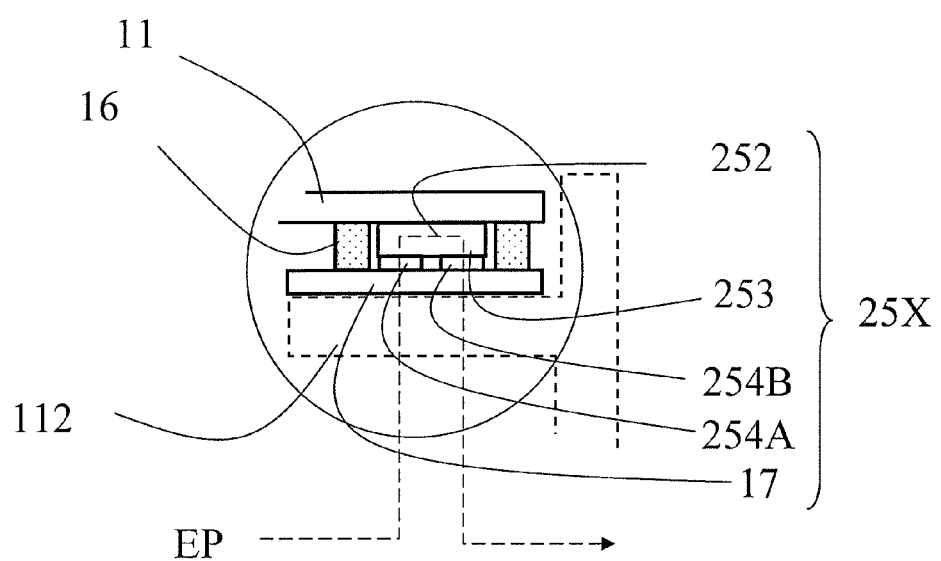
FIG. 6 shows the second embodiment being pressed.

FIG. 6 shows the second embodiment being pressed.

Before the cover glass 11 is pressed, the space 253 in between the piezoresistive material 252 and the electrodes 254A, 254B keeps the electrical path open between the first electrode 254A and the second electrode 254B. After the cover glass 11 is pressed, the space 253 disappears. When the piezoresistive material 252 touches the first and second electrodes 254A, 254B, the electrical path becomes closed between the first electrode 254A and the second electrode 254B through the piezoresistive material 252. The closed electrical path is shown as the dashed line EP.

Figures 7A, 7B:
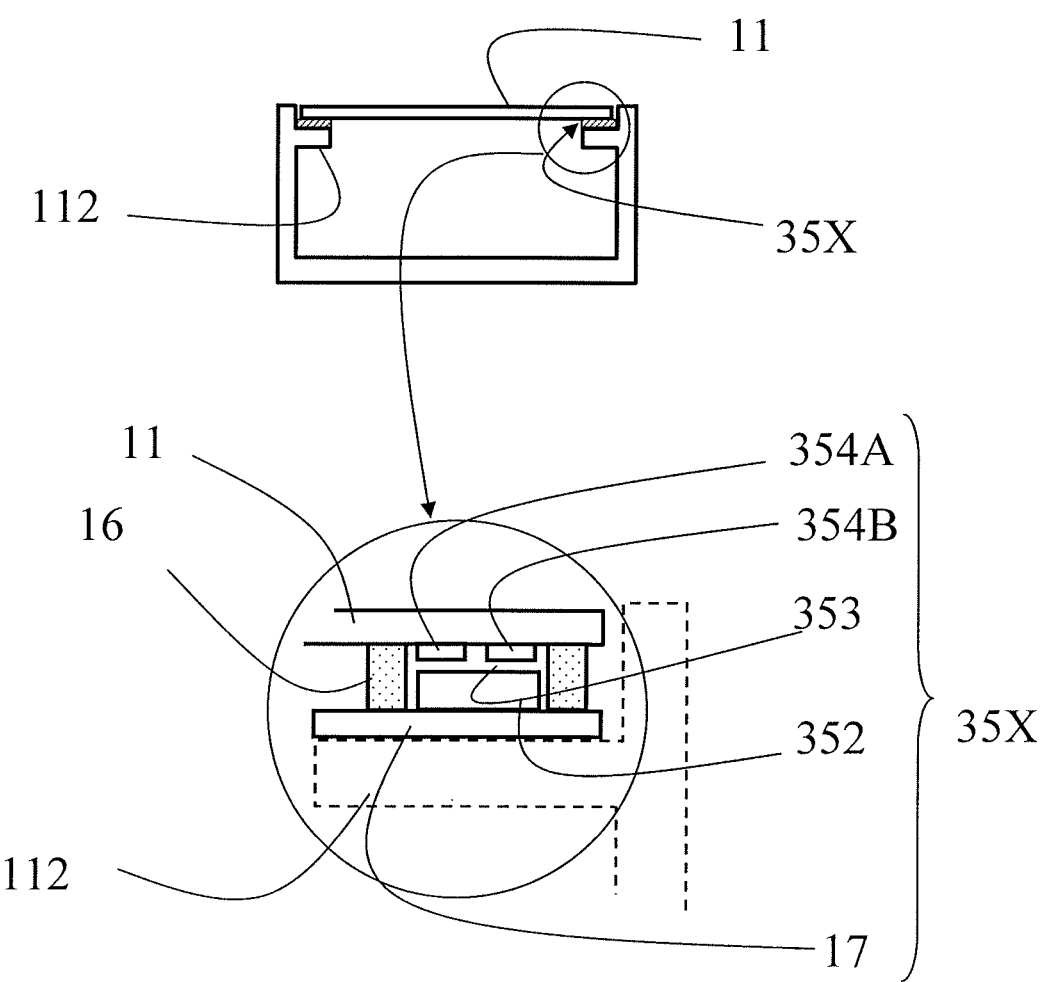
FIG. 7A shows a fourth embodiment of the present invention.
FIG. 7B shows an enlarged view of partial area of FIG. 7A.

FIG. 7A shows a fourth embodiment of the present invention.

A cover glass 11 is mounted on top of a cell phone 10. A microstructure 35X is configured in between the cover glass 11 and the flange 112. The microstructure 35X incorporating the cover glass 11 forms a CGPB according to the present invention.

FIG. 7B shows an enlarged view of partial area of FIG. 7A.

The microstructure 35X is configured on bottom surface of the cover glass 11. The cover glass 11 is configured on top of the microstructure 35X. A first electrode 354A and a second electrode 354B are configured on bottom surface of the cover glass 11. A space 353 is reserved under the electrodes 354A, 354B. A piece of piezoresistive material 352 is configured under the space 353 and formed on a bottom substrate 17. A pair of depressible spacers 16, in the section view, is configured in between the cover glass 11 and the bottom substrate 17 for keeping the space 353 in between the electrodes 354A, 354B and the piezoresistive material 352.

Figure 8:
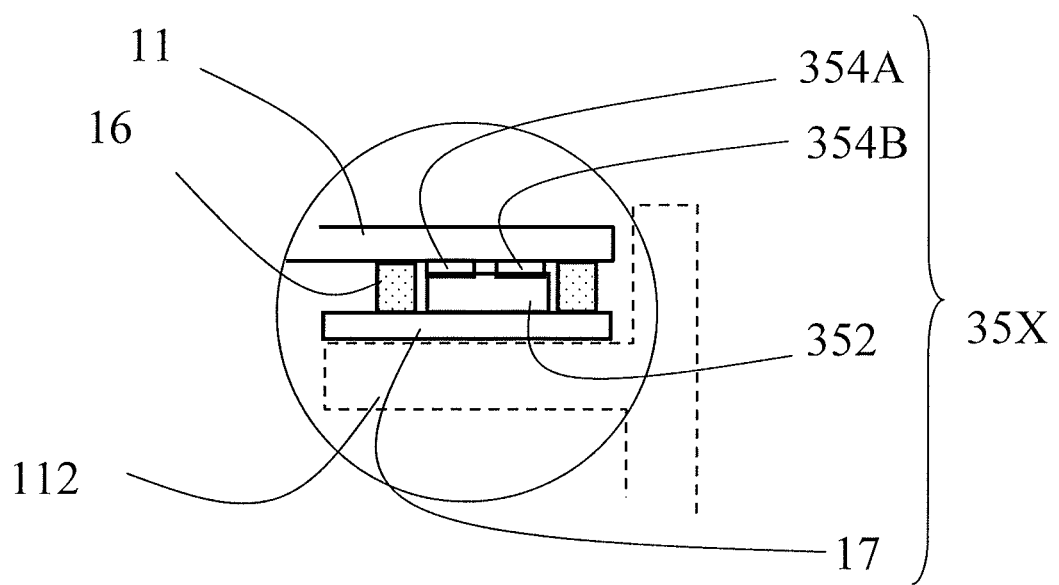
FIG. 8 shows the fourth embodiment being pressed.

FIG. 8 shows the fourth embodiment being pressed.

Before the cover glass 11 is pressed, the space 353 in between the electrodes 354A, 354B and the piezoresistive material 352 keeps the electrical path open between the first electrode 354A and the second electrode 354B. After the cover glass 11 is pressed, the space 353 disappears. When the electrodes 354A, 354B touch the piezoresistive material 352, the electrical path becomes closed between the first electrode 354A and the second electrode 354B through the piezoresistive material 352.

Figure 9:
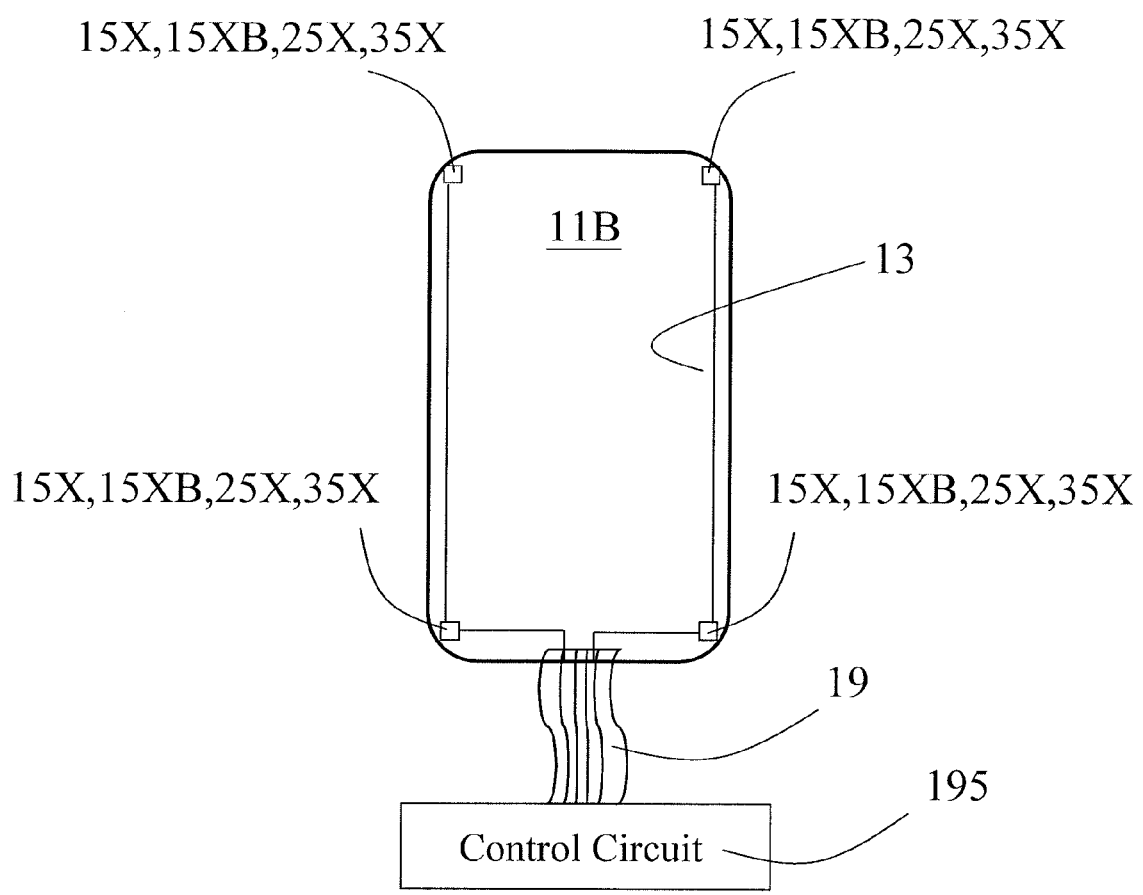
FIG. 9 shows a first application of the CGPB.

FIG. 9 shows a first application of the CGPB.

Four CGPBs of either 15X, 15XB, 25X, or 35X, are configured on a bottom surface 11B of the cover glass 11. A CGPB is configured on each of the four corners of the cover glass 11. Each of the CGPBs electrically couples to a piece of flexible circuit connector 19 through circuit 13. The flexible circuit connector 19 electrically couples to a control circuit 195. The control circuit 195 is configured to control functions of the image display module (not shown).

Figure 10:
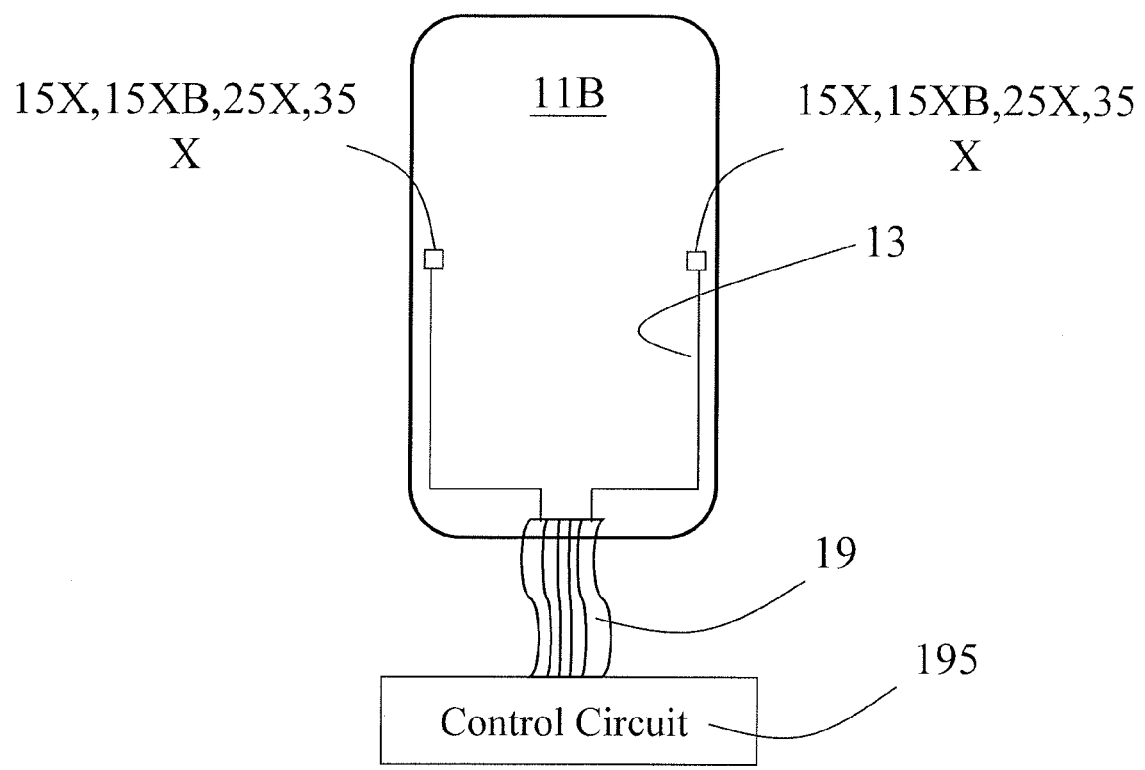
FIG. 10 shows a second application of the CGPB.

FIG. 10 shows a second application of the CGPB.

Two CGPBs of either 15X, 15XB, 25X, or 35X, are configured on a bottom surface of the cover glass 11. A CGPB is configured on each of the left and right sides. Each of the CGPBs electrically couples to a piece of flexible circuit connector 19 through circuit 13. The flexible circuit connector 19 electrically couples to a control circuit 195. The control circuit 195 is configured to control functions of the image display module (not shown).

Figure 11:
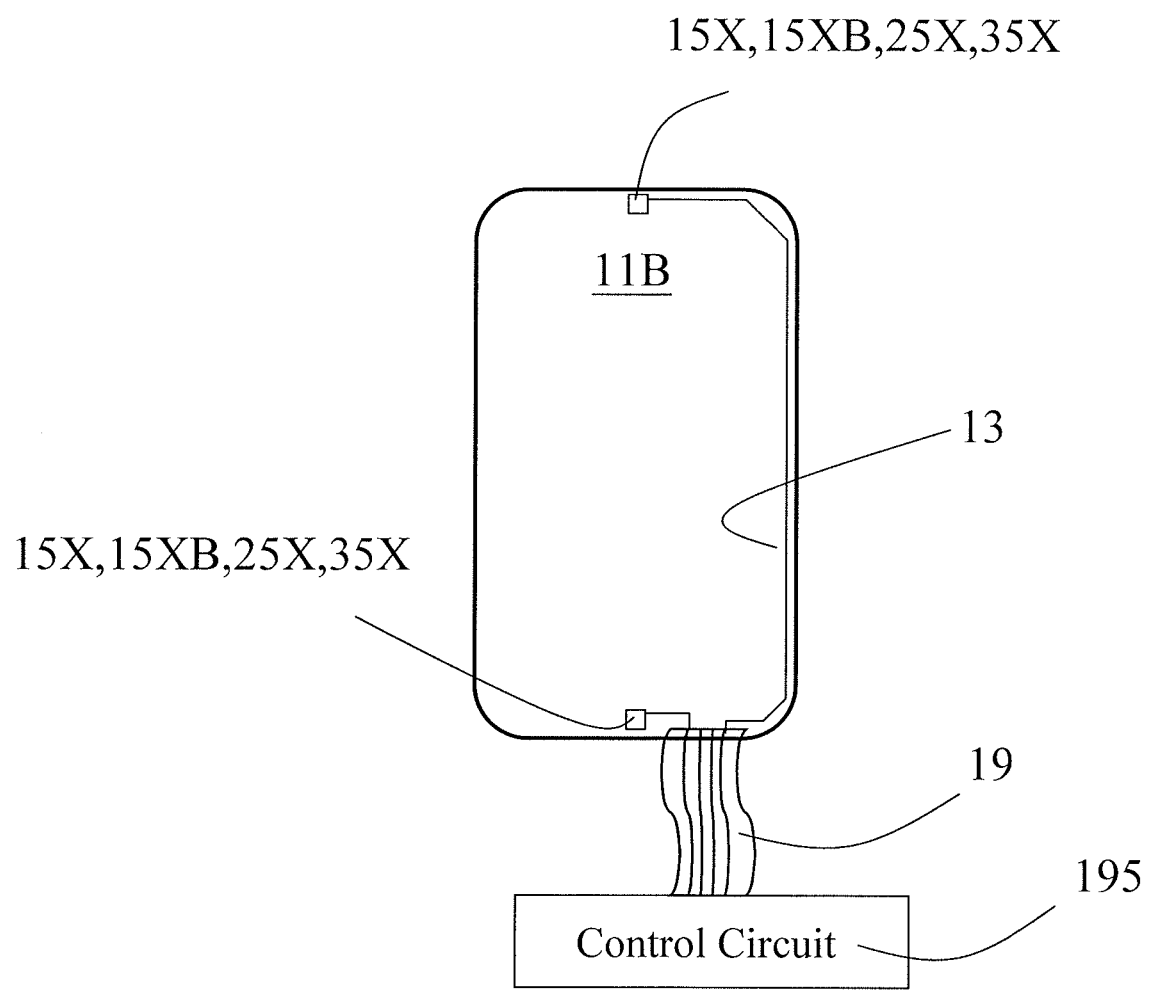
FIG. 11 shows a third application of the CGPB.

FIG. 11 shows a third application of the CGPB.

Two CGPBs of either 15X, 15XB, 25X, or 35X, are configured on a bottom surface of the cover glass 11. A CGPB is configured on each of the top and bottom sides. Each of the CGPBs having circuit 13 electrically couples to a piece of flexible circuit connector 19. The flexible circuit connector 19 electrically couples to a control circuit 195. The control circuit 195 is configured to control functions of the image display module (not shown).

Figure 12:
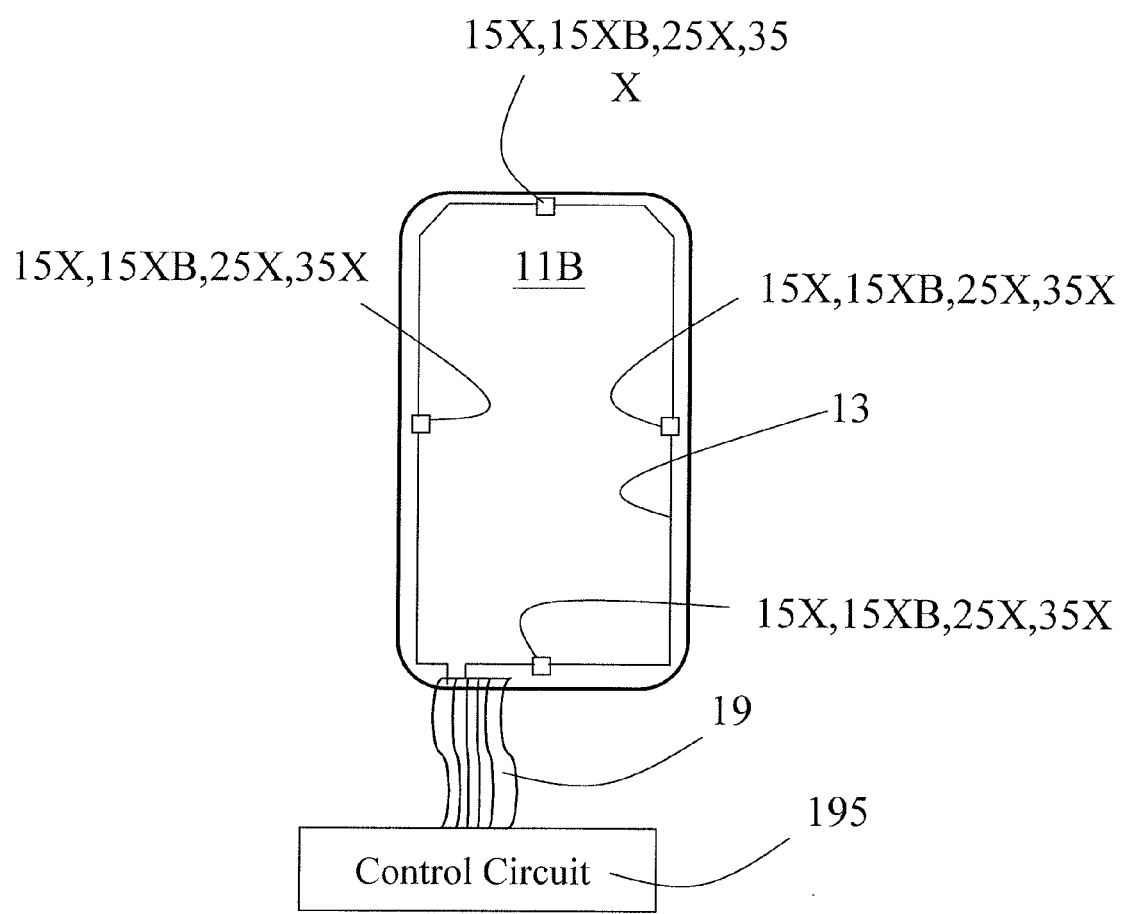
FIG. 12 shows a fourth application of the CGPB.

FIG. 12 shows a fourth application of the CGPB.

Four CGPB of either 15X, 15XB, 25X, or 35X, are configured on a bottom surface of the cover glass 11. A CGPB is configured on each of the four sides of the cover glass 11. Each of the CGPBs electrically couples to a piece of flexible circuit connector 19 through circuit 13. The flexible circuit connector 19 electrically couples to a control circuit 195. The control circuit 195 is configured to control functions of the image display module (not shown).

Figures 13A, 13B:
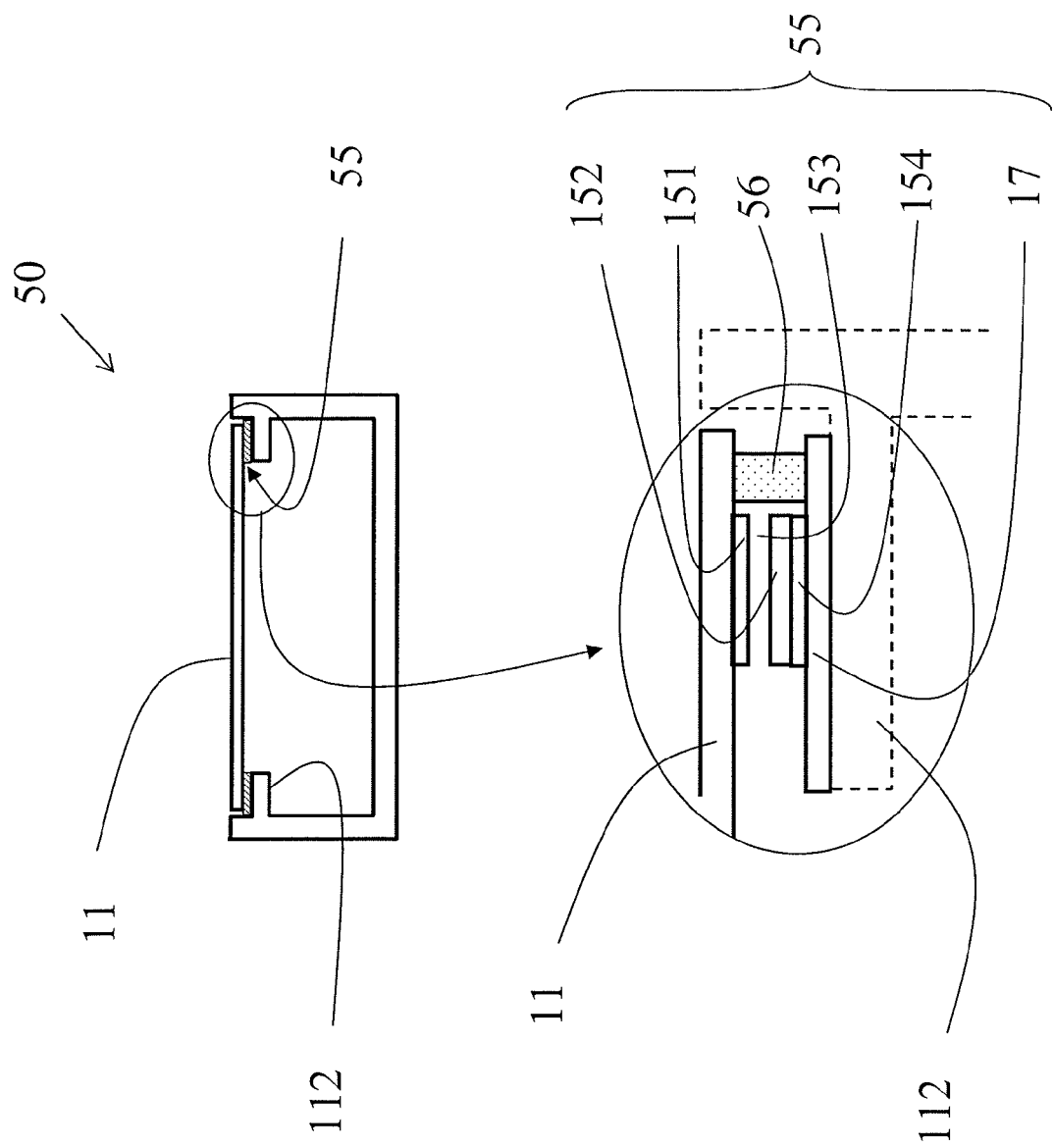
FIGS. 13A~13B show a fifth embodiment of the present invention.

FIGS. 13A~13B show a fifth embodiment of the present invention.

FIG. 13A discloses a cell phone 50 where a microstructure 55 is configured in between the cover glass 11 and the fringe 112.

FIG. 13B shows the details of the microstructure 55. The microstructure 55 includes a top electrode 151 configured on bottom surface of the cover glass 11; a space 153 reserved under the top electrode 151; a piece of pressure-sensitive material 152 configured under the space 153; a bottom electrode 154 configured on bottom of the pressure-sensitive material 152; a bottom substrate 17 configured on bottom of the bottom electrode 154; and a depressible sealing ring 56 configured on an outer periphery of the cover glass 11, and configured in between the cover glass 11 and the bottom substrate 17.

The function of the sealing ring 56 of FIG. 13B is equivalent to the double-sided spacers 16 as shown in FIG. 2B. However, the single-sided sealing ring 56 makes the device simpler in structure while providing encapsulation and maintaining good electrical sensitivity for the cover glass pressure.

Figure 14A:
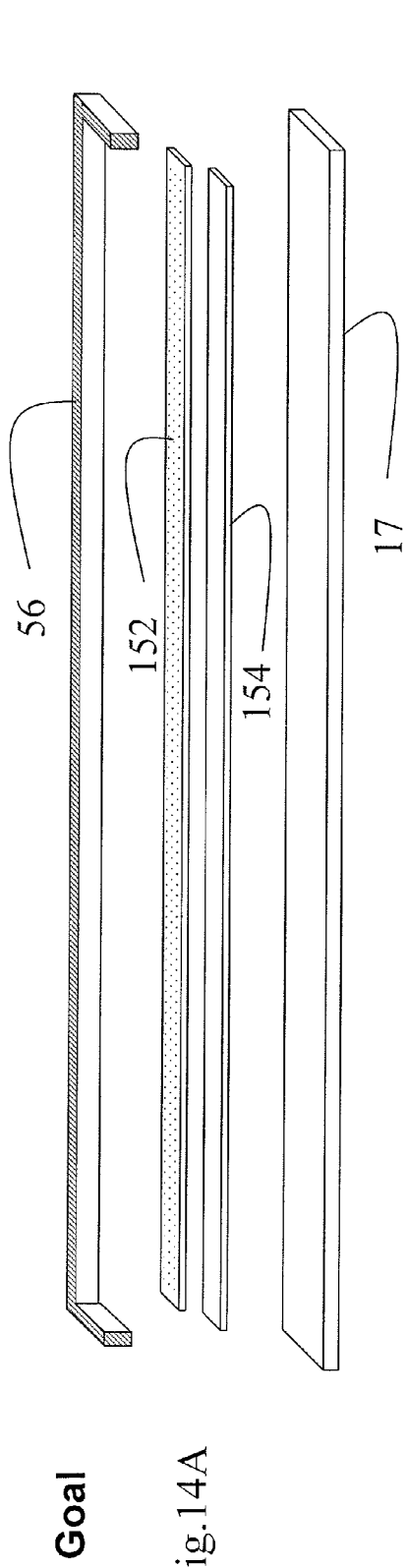
FIGS. 14A~14C show the structure for the fifth embodiment.
Figure 14B:
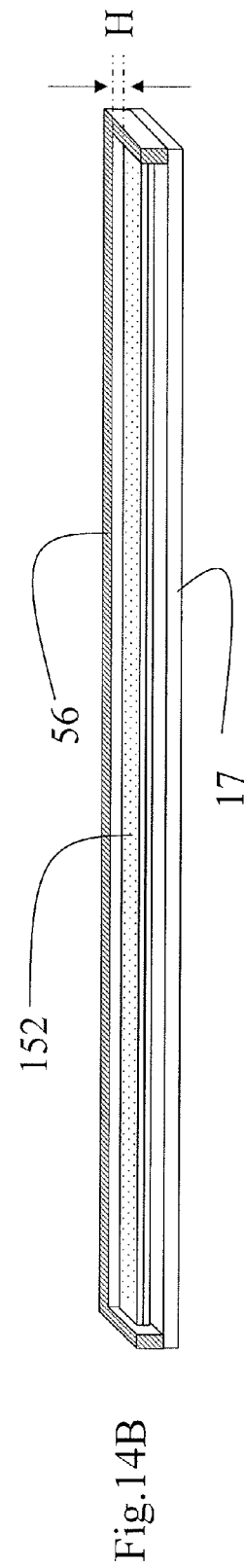
Figure 14C:
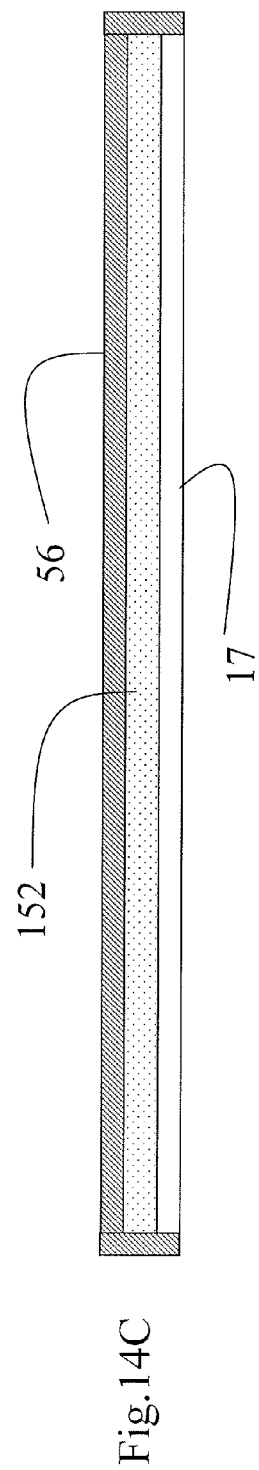

FIGS. 14A~14C show the structure for the fifth embodiment.

FIG. 14A shows an exploded view of the bottom parts of the microstructure 55. A depressible ring 56 is configured on top, a pressure-sensitive material 152 and a bottom electrode 154 are configured in the middle, and a bottom substrate 17 is configured on bottom.

FIG. 14B shows the combination of the components disclosed in FIG. 14A.

FIG. 14B shows a depressible ring 56 is configured on top of the substrate 17. The pressure-sensitive material 152 is configured on top of the bottom electrode 154. The bottom electrode 154 is configured on top of the bottom substrate 17. The depressible ring 56 has a height H close or taller than the top surface of the pressure-sensitive material 152.

FIG. 14C shows a top view of the combination of FIG. 14B.

FIG. 14C shows that the depressible ring 56 is made three sides, one along the longitudinal side and two along the latitudinal side, of the periphery of the bottom substrate 17, and however two sides or single side ring can also be made according to design choices. For example, each of the left 56L and the right 56R is a three-sided depressible ring 56 and each of the top 56T and the bottom 56B is a single-sided depressible ring 56 as exemplarily shown in FIG. 15A.

FIG. 15A shows a top view of the components for the fifth embodiment of the present invention.

FIG. 15A shows that a top depressible sealing adhesive 56T, a bottom depressible sealing adhesive 56B, a left depressible sealing adhesive 56L, and a right depressible sealing adhesive 56R are configured along four sides under the cover glass 11 for sealing the device from being contaminated by capillary seepage of water, sweat, or dust, etc. The pressure-sensitive material 152 in combination with the underlying bottom electrode 154 is configured on the inner side of each depressible sealing adhesive 56T, 56B, 56L, 56R.

FIG. 15B shows a bottom view of the cover glass for the fifth embodiment of the present invention.

FIG. 15B shows four top electrodes 151 are made on bottom surface of the cover glass 11. Each of the four top electrodes 151 is aligned with a corresponding bottom electrode 154 which is configured under a corresponding pressure-sensitive material 152 (see FIG. 14A).

FIGS. 16A~16C show a gap between neighboring sealing adhesive. FIG. 16A shows that a gap G exists in between neighboring sealing adhesive 56T and 56R. FIG. 16B shows an enlarged view of the gap G. FIG. 16C shows sealing glue SG is filled into the gap for sealing the gap G.

FIGS. 17A~17C show a sixth embodiment of the present invention.

FIG. 17A shows a seamless sealing ring 562 is used so that no gap exists as the one shown in FIG. 16A. FIG. 17B shows a section view according to line DD' of FIG. 17A. The rectangular sealing ring 562 is configured on outer side of each combination of pressure-sensitive material 152 and bottom electrode 154. FIG. 17C shows an enlarged view of the corner, where no gap exists in the rectangular sealing ring 562 in this design. The rectangular sealing ring 562 is made integrated with the substrate 17.

FIGS. 18A~18C show a seventh embodiment of the present invention.

FIG. 18A shows a top view of a depressible rectangular sealing ring 66 which has a shorter wall 66I configured on the inner side of the ring 66, and a taller wall 66O configured on an outer side of the rectangular sealing ring 66. A recess 66R is formed in between the inner wall 66I and the outer wall 66O. A top sub-unit 68T, a bottom sub-unit 68B, a left sub-unit 68L, and a right sub-unit 68R are made and ready to be configured on four sides in the recess 66R. Each of the sub-unit 68X is made a stack of piezoresistive material 152, a bottom electrode 154, and a substrate 17. FIG. 18B shows a section view of FIG. 18A according to line AA'. The ring 66 has a taller wall 66O and an inner wall 66I. A rectangular recess 66R is formed in between the inner wall 66I and the outer wall 66O. FIG. 18C shows the right unit 68R is a stack of piezoresistive material 152, a bottom electrode 154, and a substrate 17.

FIGS. 19A~19B show a status after the sub-unit configured in the recess.

FIG. 19A is a top view of a combination of the components shown in FIG. 18A. FIG. 19A shows that each of the top unit 68T, the bottom unit 68B, the left unit 68L, and the right unit 68R is configured in one of the four sides in the recess 66R.

FIG. 19B shows a section view of FIG. 19A according to line BB'. FIG. 19B shows that the sub-unit 68R is configured in the recess 66R.

FIGS. 20A~20B show the assembly of the seventh embodiment according to the present invention.

FIG. 20A shows a microstructure 65 configured in between the cover glass 11 and the flange 112. FIG. 20B shows a top electrode 151 made on a bottom surface of the cover glass 11. A space 153 is reserved under the top electrode 151; a piece of pressure-sensitive material 152 is configured under the space 153; a bottom electrode 154 is configured on bottom of the pressure-sensitive material 152; a bottom substrate 17 is configured on bottom surface of the bottom electrode 154; and a depressible sealing ring 66 extended along a periphery of the cover glass 11, and configured in between the cover glass 11 and the flange 112. The depressible sealing ring 66 has a shorter wall 66I configured on an inner side of the ring 66 and a taller wall 66O configured on an outer side. A rectangular recess 66R is configured in between the two walls, for housing the bottom substrate 17 which carries the bottom electrode 154 and the pressure-sensitive material 152 thereon.

While several embodiments have been described by way of example, it will be apparent to those skilled in the art that various modifications may be configured without departing from the spirit of the present invention. Such modifications are all within the scope of the present invention, as defined by the appended claims.

What is claimed is:

1. A cover glass pressure button for an electronic device, comprising:
   a cover glass;
   at least one microstructure, comprising:
      a first electrode;
      a pressure-sensitive material;
      a second electrode; and
      a space between (i) the pressure-sensitive material and (ii) at least one of the first electrode and the second electrode, in a first state when the cover glass is not depressed,
      wherein, in a second state when the cover glass is depressed, the pressure-sensitive material contacts both the first and second electrodes to create an electrical path from the first electrode to the second electrode via the pressure-sensitive material; and
   a depressible sealing ring, configured under the cover glass for sealing an inside of the electronic device,
   wherein the sealing ring defines said space in the first state when the cover glass is not depressed, the sealing ring being compressible to bring the pressure-sensitive material into contact with the first and second electrodes in the second state.

2. A cover glass pressure button for an electronic device as claimed in claim 1, wherein:
   the sealing ring extends around the at least one microstructure.

3. A cover glass pressure button for an electronic device as claimed in claim 2, wherein:
   the first electrode is configured on a bottom surface of the cover glass;
   the pressure-sensitive material is configured under the first electrode; and
   the second electrode is configured on a bottom of the pressure-sensitive material.

4. A cover glass pressure button for an electronic device as claimed in claim 3, wherein:
   the space is reserved in between the first electrode and the pressure-sensitive material.

5. A cover glass pressure button for an electronic device as claimed in claim 2, wherein:
   the first electrode and the second electrode are configured on a bottom surface of the cover glass.

6. A cover glass pressure button for an electronic device as claimed in claim 5, wherein:
   the pressure-sensitive material is configured under the electrodes.

7. A cover glass pressure button for an electronic device as claimed in claim 6, wherein:
   the space is reserved in between the electrodes and the pressure-sensitive material.

8. A cover glass pressure button for an electronic device as claimed in claim 2, wherein:
the pressure-sensitive material is configured on a bottom surface of the cover glass.

9. A cover glass pressure button for an electronic device as claimed in claim 8, wherein:
the first electrode and the second electrode are configured under the pressure-sensitive material.

10. A cover glass pressure button for an electronic device as claimed in claim 9, wherein:
the space is reserved in between the electrodes and the pressure-sensitive material.

11. A cover glass pressure button for an electronic device as claimed in claim 1, wherein the sealing ring includes a top sealing stripe, a bottom sealing stripe, a left sealing stripe, and a right sealing stripe corresponding to four sides of the electronic device, respectively.

12. A cover glass pressure button for an electronic device as claimed in claim 11, further comprising:
sealing glue, filled in a gap in between neighboring sealing stripes.

13. A cover glass pressure button for an electronic device as claimed in claim 1, wherein the sealing ring is a seamless enclosed ring.

14. A cover glass pressure button for an electronic device as claimed in claim 1, wherein the sealing ring comprises:
a shorter wall, configured on an inner side of the ring;
a taller wall, configured on an outer side of the ring; and
a recess, configured in between the two walls, wherein the at least one microstructure is at least partially arranged in the recess.

15. A cover glass pressure button for an electronic device, comprising:
a cover glass; and
at least one microstructure, comprising:
a first electrode;
a pressure-sensitive material;
a second electrode; and
a depressible spacer, configured under the cover glass and defining a space between (i) the pressure-sensitive material and (ii) at least one of the first electrode and the second electrode, in a first state when the cover glass is not depressed,
wherein, in a second state when the cover glass is depressed, the spacer is compressible to cause the pressure-sensitive material to contact both the first and second electrodes to create an electrical path from the first electrode to the second electrode via the pressure-sensitive material.

16. A cover glass pressure button for an electronic device as claimed in claim 15, wherein:
the spacer extends around the at least one microstructure.

17. A cover glass pressure button for an electronic device as claimed in claim 16, wherein:
the first electrode is configured on a bottom surface of the cover glass;
the pressure-sensitive material is configured under the first electrode; and
the second electrode is configured on a bottom of the pressure-sensitive material.

18. A cover glass pressure button for an electronic device as claimed in claim 17, wherein:
the space is reserved in between the first electrode and the pressure-sensitive material.

19. A cover glass pressure button for an electronic device as claimed in claim 16, wherein:
the first electrode and the second electrode are configured on a bottom surface of the cover glass.

20. A cover glass pressure button for an electronic device as claimed in claim 19, wherein:
the pressure-sensitive material is configured under the electrodes.

21. A cover glass pressure button for an electronic device as claimed in claim 20, wherein:
the space is reserved in between the electrodes and the pressure-sensitive material.

22. A cover glass pressure button for an electronic device as claimed in claim 16, wherein:
the pressure-sensitive material is configured on a bottom surface of the cover glass.

23. A cover glass pressure button for an electronic device as claimed in claim 22, wherein:
the first electrode and the second electrode are configured under the pressure-sensitive material.

24. A cover glass pressure button for an electronic device as claimed in claim 23, wherein:
the space is reserved in between the electrodes and the pressure-sensitive material.

25. A cover glass pressure button for an electronic device, comprising:
a cover glass;
a depressible spacer, configured under the cover glass and comprising:
a taller wall, having an upper end contacting a lower surface of the cover glass,
a shorter wall, having an upper end spaced from the lower surface of the cover glass, and
a bottom section, connecting lower ends of the walls; and
at least one microstructure arranged between the walls and above the bottom section of the spacer, the at least one microstructure comprising:
a first electrode;
a pressure-sensitive material; and
a second electrode;
wherein, in a first state when the cover glass is not depressed, the pressure-sensitive material is spaced from at least one of the first electrode and the second electrode, and
wherein, in a second state when the cover glass is depressed, the pressure-sensitive material contacts both the first and second electrodes to create an electrical path from the first electrode to the second electrode via the pressure-sensitive material.

* * * * *